(12) United States Patent
Heminger et al.

(10) Patent No.: US 9,520,388 B2
(45) Date of Patent: Dec. 13, 2016

(54) METHOD OF FORMING A SEMICONDUCTOR DEVICE AND STRUCTURE THEREFOR

(71) Applicant: SEMICONDUCTOR COMPONENTS INDUSTRIES, LLC, Phoenix, AZ (US)

(72) Inventors: David M. Heminger, Seremban (MY); Thomas Keena, Chandler, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/531,380

(22) Filed: Nov. 3, 2014

(65) Prior Publication Data

US 2016/0126236 A1    May 5, 2016

(51) Int. Cl.
| | |
|---|---|
| H01L 29/66 | (2006.01) |
| H01L 27/02 | (2006.01) |
| H01L 27/06 | (2006.01) |
| H01L 29/06 | (2006.01) |
| H01L 21/8222 | (2006.01) |

(52) U.S. Cl.
CPC ....... *H01L 27/0259* (2013.01); *H01L 21/8222* (2013.01); *H01L 27/0635* (2013.01); *H01L 27/0647* (2013.01); *H01L 29/0684* (2013.01)

(58) Field of Classification Search
CPC ............. H01L 21/8222; H01L 21/8248; H01L 21/8249; H01L 27/0255; H01L 27/0259; H01L 27/0274; H01L 27/0277; H01L 27/0623; H01L 27/0635; H01L 27/0647; H01L 27/0652; H01L 27/0658; H01L 27/0664; H01L 27/067; H01L 27/0711; H01L 27/07; H01L 27/0229

USPC ....... 257/173, 355, 361, 362, 363, 364, 367; 361/90, 91, 91.1, 56
See application file for complete search history.

(56) References Cited

U.S. PATENT DOCUMENTS

| | | | |
|---|---|---|---|
| 5,276,582 A | | 1/1994 | Merrill |
| 5,550,698 A | * | 8/1996 | Tabuchi ............. H03K 17/0826 257/E27.056 |
| 5,751,052 A | | 5/1998 | Heminger et al. |
| 2006/0054975 A1 | * | 3/2006 | Chen ................... H01L 29/8605 257/384 |

OTHER PUBLICATIONS

On Semiconductor, "MUN2213, MMUN2213L, MUN5213, DTC144EE, DTC144EM3, NSBC144EF3—NPN Transistors with Monolithic Bias Resistor Network," Publication Order No. DTC144E/D, Mar. 2013—Rev. 2, 12 pages.

(Continued)

*Primary Examiner* — Earl Taylor
*Assistant Examiner* — Samuel Park
(74) *Attorney, Agent, or Firm* — Robert F. Hightower

(57) ABSTRACT

In one embodiment, a semiconductor device may include a first transistor having a first current carrying electrode, a second current carrying electrode, and a control electrode; a first bipolar transistor having a collector coupled to the first current carrying electrode of the first transistor, a base coupled to the second current carrying electrode of the first transistor, and an emitter of the first bipolar transistor coupled to a first node of the semiconductor device. In an embodiment, the first node is connected to a terminal of a semiconductor package. An embodiment may include a semiconductor component coupled between the base of the first bipolar transistor and the emitter of the second bipolar transistor.

19 Claims, 3 Drawing Sheets

(56) References Cited

OTHER PUBLICATIONS

On Semiconductor, "MUN5213DW1, NSBC144EDXV6, NSBC144EDP6—NPN Transistors with Monolithic Bias Resistor Network," Publication Order No. DTC144ED/D, Mar. 2014—Rev. 1, 8 pages.

* cited by examiner

US 9,520,388 B2

METHOD OF FORMING A SEMICONDUCTOR DEVICE AND STRUCTURE THEREFOR

BACKGROUND OF THE INVENTION

The present invention relates, in general, to electronics, and more particularly, to semiconductors, structures thereof, and methods of forming semiconductor devices.

In the past, the semiconductor industry manufactured individual transistors along with bias resistors connected to the transistors together on a semiconductor die. Such combinations of transistors and resistors in an individual package were often referred to as a bias resistor transistor (BRT). One example of such a bias resistor transistor (BRT) was the MUN2213 that was available from Semiconductor Components Industries, LLC., (dba "On Semiconductor") in Phoenix Ariz. These BRT's typically were a bipolar power transistor that included a series base resistor. The BRT's also often included an emitter-base resistor connected between the base and emitter of the bipolar transistor.

One problem with such BRT's was the performance in response to an electro-static discharge (ESD) event. The BRT's often had a human body model rating of 2 KV or less. Since ESD events usually occurred at 3 KV or greater, the ESD event could damage the BRT. In some cases, the ESD event would rupture the oxide that was adjacent to the contact pad that was used to form an electrical connection between the base of the BRT and a lead or terminal of the package in which the BRT was formed.

Accordingly, it is desirable to have a BRT that has improved performance in response to an ESD event, that has a higher human body model rating, or that minimizes damage to the BRT in response to an ESD event.

Figure 1:
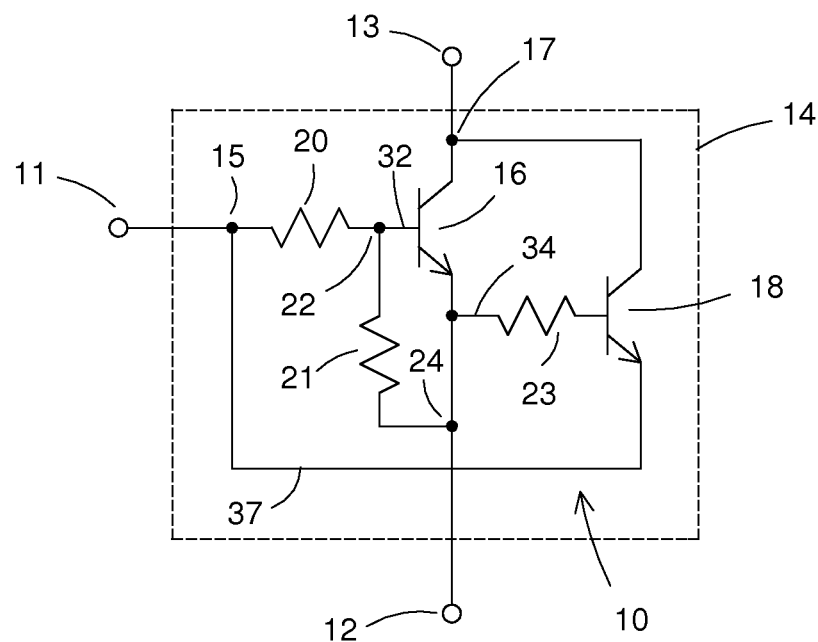
FIG. 1 schematically illustrates an example of an embodiment of a portion of a semiconductor device in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

DETAILED DESCRIPTION OF THE DRAWINGS

FIG. 1 schematically illustrates an example of an embodiment of a portion of semiconductor device, for example a bias resistor transistor semiconductor device 10, that among other things has improved performance to an ESD event. Device 10 includes a main transistor 16 and a protection transistor 18. In one embodiment, device 10 may be formed in a semiconductor package 14 that includes a base terminal 11, a collector terminal 13, and an emitter terminal 12. In one embodiment, device 10 is formed having only three external terminals. In an embodiment, device 10 is formed in a semiconductor package having only three external terminals. An electrical component may be connected in series with a base of transistor 16. In some embodiments, the electrical component may be a semiconductor component may be connected in series with the base of transistor 16. Other embodiments may include that the electrical component may be a base resistor 20 that may be connected in series with the base of transistor 16. In some embodiments, resistor 20 may function as a current limiting resistor for the base current of transistor 16. In some embodiments, a resistor 21 may be connected between the base of transistor 16 and an emitter of transistor 16. In an embodiment, the emitter of transistor 18 may be connected to a base node or node 15 such that resistor 20 is in series between node 15 and the base of transistor 16. An embodiment includes that node 15 may be a base contact pad or base conductor pad or base contact conductor of device 10, as will be seen further hereinafter. An embodiment may include that the emitter of transistor 18 is connected to node 15. As will be seen further hereinafter, an embodiment includes that node 15 is connected to terminal 11, thus the emitter of transistor 18 may be connected to terminal 11 and such that resistor 20 may be connected in series between node 15, or terminal 11 in an embodiment, and the base of transistor 16. Typically, the collector of transistor 18 is connected to the collector of transistor 16 as illustrated by a node 17. In an embodiment, the base of transistor 18 is connected to the emitter of transistor 16. In some embodiments, an optional protection resistor or optional resistor 23 may be formed in series between the base of transistor 18 and the emitter of transistor 16. In the event that a voltage may be applied to terminal 11 which exceeds an emitter-base breakdown voltage of transistor 18, resistor 23 can limit the emitter-base current to transistor 18 to minimize damaging transistor 18.

In normal operation, a voltage may be applied to the base of transistor 16 to enable transistor 16 to conduct a current between the collector and emitter of transistor 16. For example, a voltage may be applied to terminal 11 in order to enable transistor 16 to conduct a current between collector terminal 13 and emitter terminal 12. The voltage applied to enable transistor 16 reverse biases the base-emitter junction of transistor 18 such that transistor 18 is not enabled.

During an ESD discharge to device 10 or ESD event, transistor 18 assists in protecting device 10 from the ESD event. During the ESD event, the voltage at node 15 may increase and exceed the breakdown voltage of transistor 18. In an embodiment, the ESD event may exceed the emitter-collector breakdown voltage of transistor 18 (often referred to as the BVec). In an example embodiment, during a positive ESD event, the voltage may exceed the BVec thereby causing avalanche conduction from the emitter to the collector of transistor 18. Thus, the ESD current is discharged and does not damage transistors 16 or 18. In one embodiment, during a negative ESD event, the ESD voltage may exceed the collector-emitter breakdown voltage (BVce) of transistor 18 and transistor 18 begins to conduct current, such as for example from node 17 to node 15. The current at node 15 flows out terminal 11. In some embodiments, a portion of the current may flow from node 15 to the base of transistor 16 thereby enabling transistor 16 to conduct current from node 17 to node 24. Thus, the ESD current is discharged and does not damage transistors 16 or 18. The avalanche breakdown mode of transistor 18 provides a low resistance conduction path for the ESD current, and assists in minimizing damage to device 10. The enabling of transistor 16 as a result of the current conducted by transistor 18 provides an additional low resistance conduction path for the ESD current and also assists in minimizing damage to device 10. In most embodiments, resistor 20 is not a diffused resistor because such a configuration may form a parasitic diode between node 15 and the collector of transistor transistors 16 and 18. Such a parasitic diode or even a non-parasitic diode connected between the base to collector of transistor 16 would clamp the base to the collector. Those skilled in the art will appreciate that because of the device 10 configuration, the base-collector junction of transistor 16 is not forward biased during the ESD even and the base is not clamped to the collector voltage during normal operation.

In one example, an embodiment of device 10 withstood an eight (8) KV human body model ESD discharge without damaging device 10. This is much greater than could be withstood by prior BRT devices.

In some prior devices, there was not a low impedance path to conduct the ESD current, and the current (or energy) was often discharged through the conductor pad and through the underlying insulator thereby damaging the prior transistor.

Figure 2:
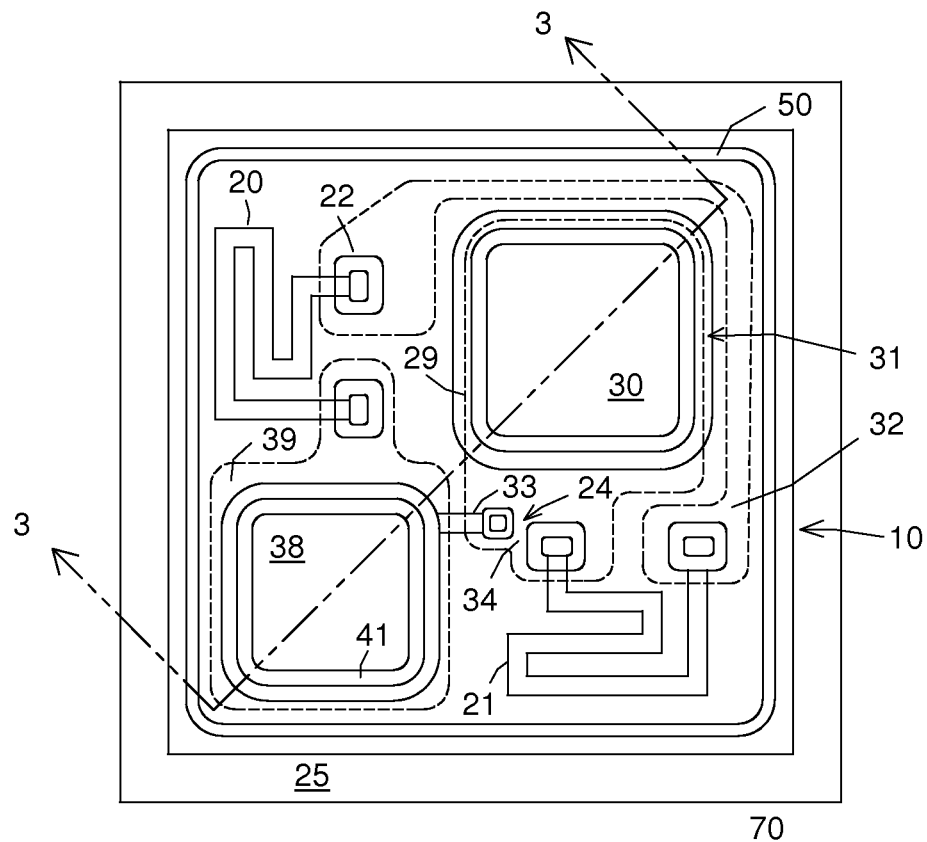
FIG. 2 illustrates an enlarged plan view of an example of an embodiment of a portion of a semiconductor die on which the semiconductor device of FIG. 1 may be formed in accordance with the present invention.

FIG. 2 illustrates an enlarged plan view of an example of an embodiment of a portion of a semiconductor die 70 on which device 10 may be formed.

Figure 3:
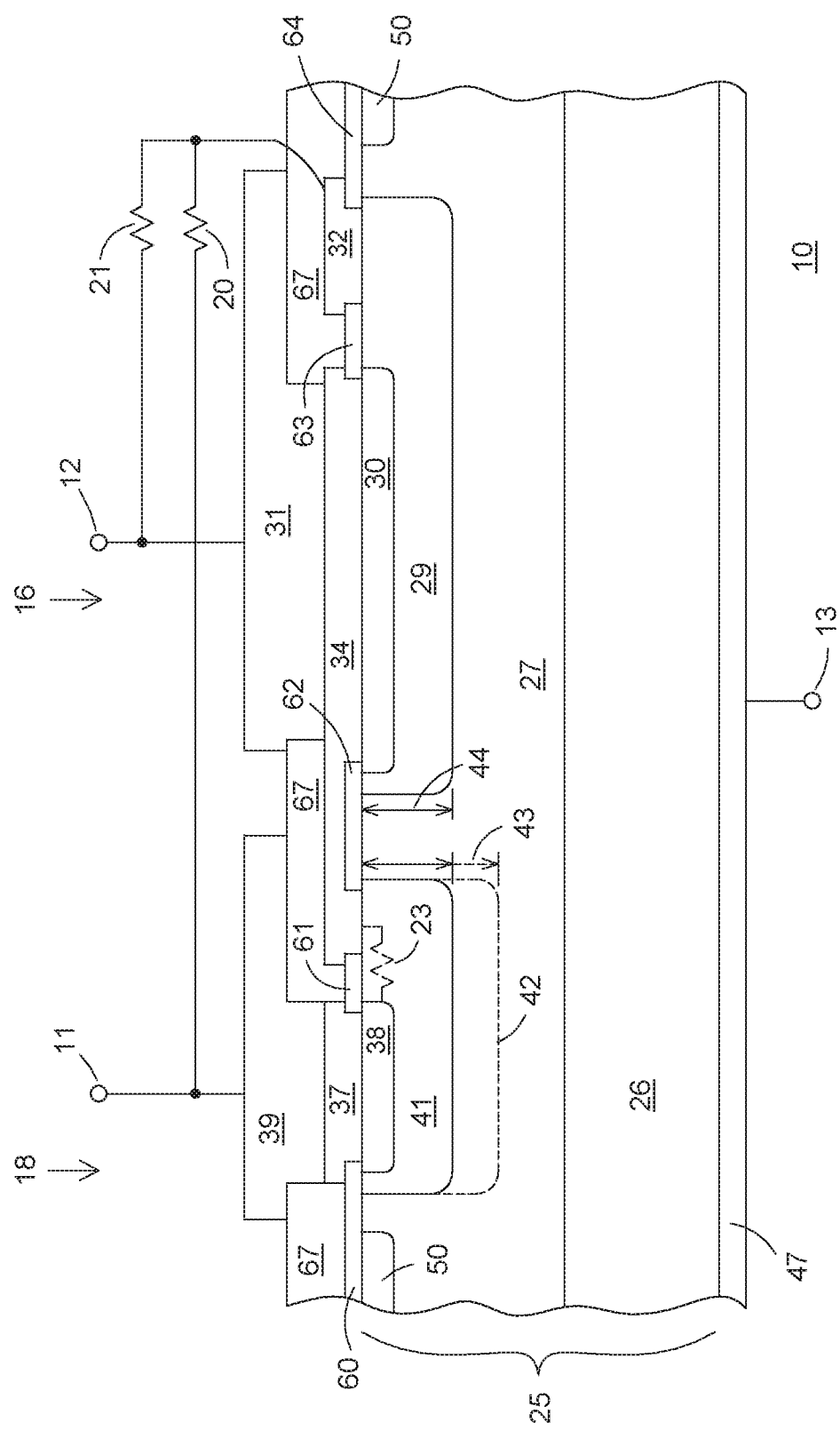
FIG. 3 illustrates an enlarged cross-sectional view of an example of an embodiment of a portion of the semiconductor die of FIG. 2 in accordance with the present invention.

FIG. 3 illustrates an enlarged cross-sectional view of die 70 along cross-section lines 3-3 illustrated in FIG. 2. This description has references to FIGS. 1-3. Device 10 is formed on a semiconductor substrate 25. In an embodiment, substrate 25 may include a bulk silicon semiconductor substrate 26 and a doped region 27. Region 27 may be formed as an epitaxial layer on substrate 26 or may be formed as a doped region within substrate 26. One embodiment may include that substrate 26 and region 27 have the same conductivity type. An embodiment may include that region 27 and substrate 26 have the same conductivity type with region 27 having a doping concentration that is lower than substrate 26. Another embodiment may include that region 27 has N-type conductivity. Transistor 16 may be formed in a first portion of substrate 25. A doped region 29 may be formed in the first portion of substrate 25 to extend from the surface of substrate 25 a distance 44 into substrate 25. An embodiment may include that region 29 extends distance 44 into region 27. In an embodiment, region 29 may have a doping type that is the opposite to substrate 25, or in some embodiments the opposite of region 27, in order to form the base for transistor 16. In some embodiments, the doping concentration of region 29 may be greater than the doping concentration of region 27. A doped region 30 may be formed within region 29 to extend a distance into region 29 that is less than distance 44. In an embodiment, region 30 forms the emitter of transistor 16. An embodiment may include that region 30 has a doping type that is the same as substrate 25, or in some embodiments the same as region 27. Another embodiment may include that region 30 has a doping concentration that is greater than the doping concentration of region 29. Some embodiments may include that region 30 has a doping concentration that is greater than greater than region 27.

An embodiment may include that transistor 18 may be formed in a second portion of substrate 25. A doped region 41 that has the same doping type as region 29 is formed to extend a distance 43 into substrate 25. An embodiment may include that region 41 extends distance 43 into region 27. Region 41 may form the base of transistor 18. In some embodiments, region 41 may form a base region of transistor 18. A doped region 38 may be formed within region 41 and typically extends a distance into region 41 that is less than distance 43. Region 38 typically forms the emitter of transistor 18 or in some embodiments an emitter region of transistor 18. In most embodiments, distance 43 and the doping concentration of region 41 are chosen to provide the desired emitter-collector breakdown voltage for transistor 18. In some embodiments, distance 43 and the doping concentration of region 41 are chosen relative to respective distance 44 and the doping concentration of region 29 to provide the desired emitter-collector breakdown voltage for transistor 18. An embodiment of a method of forming device 10 may include forming region 41 and region 29 to have different doping concentrations in order to form the desired emitter-collector breakdown voltage. Another embodiment may include forming the doping concentration of region 41 to be less than the doping concentration of region 29. In one embodiment, the doping concentrations and depths for regions 41 and 29 are selected to form a BVce for transistor 18 to be no less than the BVce for transistor 16. In some embodiments the doping concentrations and depths for regions 41 and 29 are selected to form a BVebo for transistor 18 to be greater than the BVebo for transistor 16. In some embodiments, doping concentrations and depths for regions 41 and 29 are selected to allow voltages higher than the BVebo of transistor 16 to be applied to terminal 11 during normal operation of device 10. Some embodiments may include that the doping concentrations and depths for regions 41 and 29 are selected to form a BVebo for transistor 18 to be equal to the BVebo for transistor 16. In one embodiment, region 29 may have a P-type conductivity and a doping concentration between approximately 1E15 and approximately 3E17 atoms/cm$^3$. An embodiment may include that region 41 may have a P-type doping concentration between approximately 5E14 and approximately 1E17 atoms/cm$^3$. An embodiment may include that distance 44 can be between approximately five to six (5-6) microns. In an embodiment, distance 43 Amy be formed between approximately five to eight (5-8) microns.

In an embodiment of a method of forming device 10, regions 29 and 41 may be formed at the same time or at the same processing step to have the same doping concentration and same depth such that distances 43 and 44 may be substantially equal. Another embodiment of a method of forming device 10 may include forming distance 43 to different than distance 44. For example, distance 43 may be formed to be greater than distance 44 such that the bottom of region 41 extends further into substrate 25 or in some embodiments further into region 27. Forming distance 43 independently of distance 44 facilitates adjusting the emitter-base breakdown voltage of transistor 18 to obtain a desired ESD characteristic. For example, forming distance 43 to be greater than distance 44 may result in forming a higher emitter-collector breakdown voltage for transistor 18 than for transistor 16. For example, a method of forming device 10 may include forming regions 29 and 41 at different times, or processing steps. In another embodiment of a method of forming device 10, a portion of region 41 may be formed at the same time as region 29 and another operation may be used to adjust the doping concentration of one of regions 41 or 29 in order to form the desired emitter-collector breakdown voltage for transistor 18. In another embodiment a portion of a method of forming device 10, region 41 may be formed at the same time as region 29 and another operation may be used to adjust distance 43 or 44. Alternately, a portion of region 41 may be formed at the same time as region 29 and another operation may be used to adjust distance 43 or 44 and/or the doping of one of or both of regions 29 and 41. In one embodiment, regions 30 and 38 may be formed at the same processing step or operation or substantially at the same time. In other embodiments, regions 30 and 38 may be formed separately. An embodiment may include that region 27 forms a common collector region for both transistor 16 and transistor 18. In an embodiment, substrate 25 may be formed to include the common collector region for both transistors 16 and 18. An embodiment may include forming a conductor 47 on an opposite surface of substrate 25 in order to form an electrical connection to the collector of transistors 16 and 18.

As will be seen further hereinafter, an embodiment may include forming at least a portion of transistor 18 to underlie a base contact pad or base conductor pad or base contact conductor 39 of device 10. Another embodiment may include forming at least a portion of the emitter-base junction of transistor 18, or alternately at least a portion of the intersection of regions 38 and region 41, to underlie base contact conductor 39. An embodiment may include forming at least a portion the emitter of transistor 18, such as for example a portion of region 38, to underlie base contact conductor 39. In an embodiment, a conductor 34 may be formed to electrically connect to region 30 and to region 41 in order to form an electrical connection between the emitter of transistor 16, such as region 30, and the base of transistor 18, such as region 41. For example, in an embodiment conductor 34 may form as least a portion of a node 24 illustrated in FIG. 1. An insulator 62 may be formed overlying the surface of substrate 25 and underlying conductor 34 in order to prevent forming an electrical connection between conductor 34 and underlying portions of substrate 25. In some embodiments, conductor 32 may form a base contact pad or base contact conductor 31 of transistor 16. In another embodiment, another conductor may be formed and patterned to form conductor 31 as the base conductor pad of transistor 16. An embodiment may include forming an insulator 67 underlying at least a portion of conductor 31 to, among other things, prevent conductor 31 from electrically contacting conductor 32. An embodiment may include forming conductor 31 as node 24, or alternately as a portion of node 24. In other embodiments, conductor 34 together with conductor 34 may form the base contact conductor for transistor 16. A conductor 32 may be formed to make an electrical connection to region 29 in order to form an electrical connection to the base of transistor 16. For example, conductor 32 may form at least a portion of a node 22 illustrated in FIG. 1. An insulator 63 may be formed overlying the surface of substrate 25 in order to prevent forming an electrical connection between substrate 25 and conductors 32 and/or 34. An embodiment may include forming a conductor 37 to make an electrical connection to region 38 in order to form an electrical connection to the emitter of transistor 18. In one embodiment, conductor 37 may be at least a portion of node 15 illustrated in FIG. 1.

In another embodiment, conductor 37 may be formed as base contact conductor 39. In some embodiments conductor 37 may be formed as a portion of base contact conductor 39. For example, another insulator 60 may be formed overlying substrate 25 and to have an opening overlying region 38 or at least a portion of region 38 or in another embodiment at least a portion of conductor 37. In some embodiments, conductor 39 may be at least a portion of node 15. A conductor material may be applied on insulator 60 and patterned to overlie region 38 or alternately to contact region 38 or alternately to contact conductor 37. In an embodiment, insulator 67, or at least a portion of insulator 67, may be formed underlying at least a portion of conductor 39 to prevent conductor 39 from electrically contacting conductor 34. In an embodiment conductor 39, and/or in some embodiments conductor 37, may also overlie at least the junction between region 38 and region 41, thus, the emitter-based junction of transistor 18. Some embodiments may include forming conductor 39 to overlie region 38 and region 41. An embodiment may include that all of regions 38 and 41 underlie the portion of conductor 39 that forms the contact pad. In some embodiments, an extension of conductor 39 may be formed electrically connected to conductor 37, and/or in other embodiments base contact conductor 39 may replace conductor 37. In some embodiments, an extension of base contact conductor 39, or alternately another conductor, may be used to form an electrical connection between a terminal of package 14 and the base of transistor 16. In an embodiment, an extension of base contact conductor 39, or alternately another conductor, may be used to form an electrical connection between node 15 and a terminal of package 14. For example, conductor 39 may form a wire bond contact pad such that during the steps of assembling die 70 in a semiconductor package, a wire may be bonded to conductor 39 and another other end of the wire attached to a terminal of the semiconductor package. In other embodiments, base contact conductor 39 may form a contact pad for a solder bump or other method of forming an electrical connection to a semiconductor die.

Referring again to FIG. 2, in one embodiment, resistor 20 and/or resistor 21 may be formed overlying substrate 25. For example one or both of resistors 20 and 21 may be formed as polysilicon resistors. The polysilicon resistors may be formed on the surface of insulator 67 or between insulator 67 and other underlying insulators. In other embodiments, resistors 20 and 21 may be formed as film resistors or formed as diffused resistors in substrate 25 or as other well know types of resistors. Resistor 23 may be formed as at least a portion of region 41 that is positioned between the portion of region 41 that contacts conductor 34 and the intersection of regions 38 and 41. In other embodiments, resistor 23 may be formed similarly to either one of resistors 20 and 21.

Figure 4:
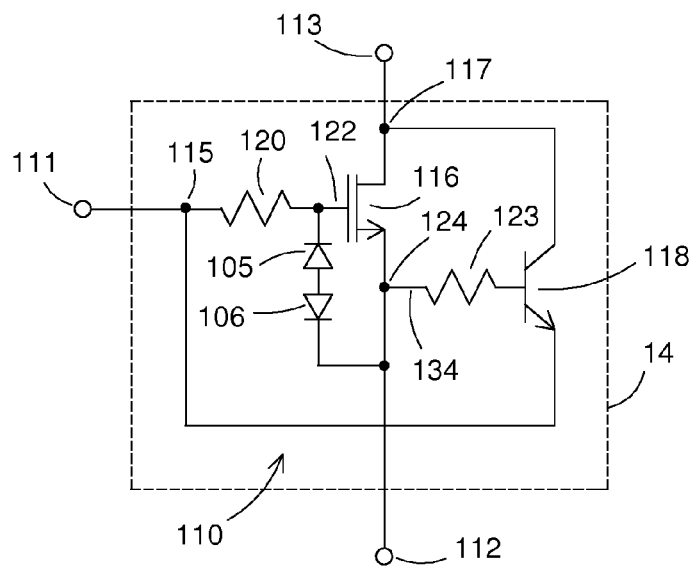
FIG. 4 schematically illustrates an example of an embodiment of a portion of a semiconductor device that is an alternate embodiment of the semiconductor device of FIG. 1 in accordance with the present invention.

FIG. 4 schematically illustrates an example of an embodiment of a portion of a semiconductor device 110 that is an alternate embodiment of device 10. Device 114 includes a main transistor 116 and a protection transistor 118. In one embodiment, device 110 may be formed in a semiconductor package 114 that includes a control terminal 111, a first current terminal 113, and a second current terminal 112. In one embodiment, transistor 116 may be an MOS transistor. An embodiment may include that terminal 113 is a drain terminal of device 110, terminal 111 is a gate terminal of device 110, and terminal 112 is a source terminal of device 110. In most embodiments, transistor 118 functions similarly to transistor 18 (FIG. 1). In some embodiments, device 110 includes an component, for example a resistor 120, that is similar to and functions similarly to the electrical component of device 10, for example resistor 20. Device 110 may include an optional resistor 123 that is similar to and functions similarly to resistor 23. A node 115 of device 110 is similar to and functions similarly to node 15 of device 10.

In response to a positive ESD event, transistor 118 functions similarly to transistor 18. As a result, some of the ESD current flows to resistor 120 and enables transistor 116. In an embodiment, the VBec of transistor 118 may be formed to be no less than a gate-to-source operating voltage of transistor 116. In an embodiment, device 110 may include an optional ESD device connected to the gate of transistor 116. In some embodiments, device 110 may include optional back-to-back diodes, such as for example diode 105 and 106 in a back-to-back configuration, connected from the gate of transistor 116 to the source of transistor 116.

In an embodiment, the emitter of transistor 118 may be connected to node 115. Node 115 may be commonly connected to terminal 111 and a first terminal of element 120. A second terminal of resistor 120 may be commonly connected to a node 122 and the gate electrode of transistor 116. A collector of transistor 118 may be commonly connected to a node 117 and the drain of transistor 116. Node 117 may be connected to terminal 113. A base of transistor 118 may be connected to a node 124 and the source of transistor 116-0124 may be connected to terminal 112. Those skilled in the art will appreciate that although transistor 116 may be illustrated and explained as an in-channel MOS transistor, and other embodiments it may be a P-channel MOS transistor. In some embodiments, transistor 116 may be a P-channel MOS transistor and transistor 118 may be a PNP bipolar transistor.

Figure 5:
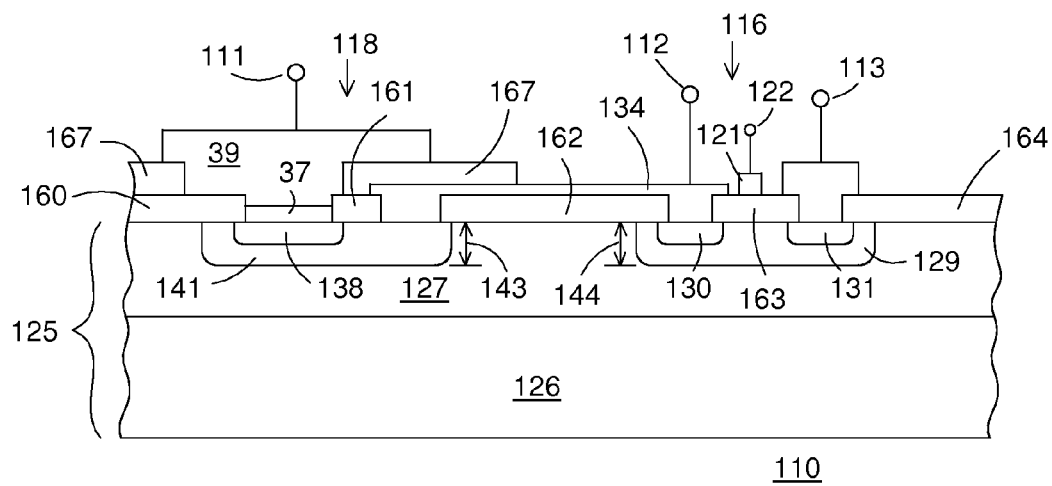
FIG. 5 illustrates an example of an embodiment of a portion of an enlarged cross-sectional view of the semiconductor device of FIG. 4 in accordance with the present invention.

FIG. 5 illustrates an example of an embodiment of a portion of an enlarged cross-sectional view of a semiconductor die that includes device 110. This description has references to FIGS. 4-5. Device 110 is formed on a semiconductor substrate 125. In an embodiment, substrate 125 may include a bulk silicon semiconductor substrate 126 and a doped region 127. In an embodiment, doped region 127 may be formed similar to region 27. An embodiment may include forming a doped region 129 may be formed in region 127 to have an opposite conductivity of region 127 and may be formed a distance 144 into region 127. In one embodiment, distance 144 is similar to and functions similarly to distance 44. A doped region 141 may be formed to have a conductivity type that is opposite to that of region 127 and may be formed a distance 143 into region 127. An embodiment may include that region 141 and distance 143 are similar to and function similarly to respective region 41 and distance 43. Doped regions 130 and 131 may be formed in region 129 to form respective drain and source regions of transistor 116. Region 129 may be a well region of transistor 116 in which a channel region may be formed. A gate electrode 121 may be formed overlying a portion of region 129.

A doped region 138 may be formed in region 141 to function as the emitter of transistor 118. An embodiment may include that region 138 is similar to and functions similarly to region 38. In an embodiment region 141, or a portion of region 141, may be formed during the steps of forming region 129. An embodiment may include that region 138, or a portion of region 138, may be formed as a portion of the steps of forming regions 130 and/or 131.

A conductor 137 may be formed to make an electrical connection to region 138. Conductor 137 may be similar to region 37. In some embodiments, conductor 137 may be omitted similar to conductor 37. A conductor 134 may be formed to electrically connect the base of transistor 118 to the drain of transistor 116. Device 110 may also include insulators 160-164, and 167. In an embodiment, insulators 160-164 are substantially similar to insulators 60-64. An embodiment may include that insulator 167 is similar to insulator 67.

Figure 6:
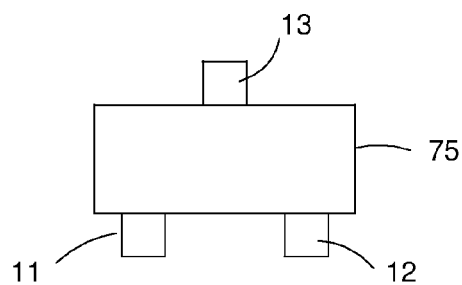
FIG. 6 graphically illustrates an enlarged plan view of an example of an embodiment of a portion of a semiconductor package that may be used for housing the semiconductor device of FIG. 1 or the semiconductor die of FIG. 2 in accordance with the present invention.

FIG. 6 graphically illustrates an enlarged plan view of an example of an embodiment of a portion of a semiconductor package 75 that may be used for package 14. Package 75 may be one of a variety of known package types such as for example an SOT-363, SOT-563, SOT-963, SOT-1123, SC-59, SC-70, or SC-75. In an embodiment, package 75 has three active terminals that are electrically connected to the three active nodes (nodes 15, 17, and 24) of device 10. Terminal 11 is connected to node 15, terminal 12 is connected to node 24, and terminal 13 is connected to node 17. In other embodiments, device 10 may be in a semiconductor package having more than three terminals but only three terminals will be the active terminals connected to nodes 15, 17, and 24 of device 10. Other embodiments may include forming device 10 in a semiconductor package with another device 10 or with other types of semiconductor device including forming the combination of devices in a semiconductor package having more than three terminals but only three terminals will be the active terminals connected to nodes 15, 17, and 24 of device 10.

Those skilled in the art will appreciate that an embodiment of a bias resistor transistor semiconductor device may comprise; a base terminal; an emitter terminal; a collector terminal; a main bipolar transistor, such as for example transistor 16, having a base, an emitter coupled to the emitter terminal, and a collector coupled to the collector terminal; a first resistor, such as for example resistor 20, having a first terminal coupled to the base of the main bipolar transistor, and having a second terminal coupled to the base terminal; and a protection bipolar transistor, such as for example transistor 18 or alternately 118, having a collector coupled to the collector of the main bipolar transistor, a base coupled to the emitter of the main bipolar transistor, and an emitter coupled to the base terminal, the protection bipolar transistor having an emitter to collector region, such as for example region 38 and underlying portions of region 27 and in some embodiments interposed region 41, that is configured to operate in avalanche mode in response to an ESD event.

Another embodiment may include that at least a portion of an emitter region of the protection bipolar transistor and at least a portion of a base region of the protection bipolar transistor is formed to underlie a base contact pad, such as for example conductor 39, of the bias resistor transistor semiconductor device.

An embodiment may include that an emitter-base junction, such as for example the portion of device 10 adjacent to the interface of regions 38 and 41, of the protection bipolar transistor is formed to underlie a base contact pad, such as for example conductor 39, of the bias resistor transistor semiconductor device.

In an embodiment, the semiconductor device may include a protection resistor having a first terminal coupled to the base of the protection bipolar transistor and a second terminal coupled to the emitter of the main bipolar transistor.

An embodiment may include that the bias resistor transistor semiconductor device is in a semiconductor package having only three active terminals.

In an embodiment, the bias resistor transistor semiconductor device may include a second resistor having a first terminal coupled to the base of the main bipolar transistor and a second terminal commonly coupled to the emitter of the main bipolar transistor and the emitter terminal.

An embodiment may include that the bias resistor transistor semiconductor device may be formed on a semiconductor substrate of a first conductivity type having a first doped region of a second conductivity type that extends a first distance into the semiconductor substrate, a second doped region of the first conductivity type formed in the first doped region, a third doped region of the second conductivity type extending a second distance into the semiconductor substrate and spaced apart from the first doped region, and a fourth doped region of the first conductivity type formed in the third doped region wherein an intersection between the third and fourth doped regions forms an emitter-base junction of the protection bipolar transistor.

In an embodiment the second distance may be greater than the first distance.

Those skilled in the art will understand that a method of forming a semiconductor device may comprise; providing a semiconductor substrate of a first conductivity type, such as for example substrate 25 or alternately 26 or alternately 125 or alternately 126, the semiconductor substrate having a first surface; forming a first doped region of a second conductivity type on the first surface of the semiconductor substrate and extending a first distance into the semiconductor substrate wherein the first doped region forms a base region of a first bipolar transistor, such as for example transistor 16; forming a second doped region of the first conductivity type in the first doped region wherein the second doped region forms an emitter region of the first bipolar transistor; forming a third doped region of the second conductivity type on the first surface of the semiconductor substrate and extending a second distance into the semiconductor substrate wherein the third doped region forms a base region of a second bipolar transistor, such as for example transistor 18; forming a fourth doped region of the first conductivity type in the third doped region wherein the fourth doped region forms an emitter region of the second bipolar transistor wherein a portion of the semiconductor substrate forms a common collector region of both the first and second bipolar transistors; forming an electrical connection between the fourth doped region and a base node of the semiconductor device; and forming a resistor in series between the base node of the semiconductor device and the first doped region.

An embodiment of the method may include forming the semiconductor device to have only three active terminals.

In an embodiment, the method may include forming a base connection pad of the semiconductor device overlying a portion of the third and fourth doped regions.

Another embodiment may include forming a base connection pad of the semiconductor device overlying at least a portion of an emitter-base junction of the second bipolar transistor.

An embodiment of the method may include forming the second distance to be one of substantially equal to the first distance or greater than the first distance.

Another embodiment of the method may include forming a breakdown voltage between the emitter region and the collector region of the second bipolar transistor to be no less than a collector-emitter breakdown voltage of the first transistor.

An embodiment may include forming an electrical connection between the third doped region and the second doped region wherein a portion of the third doped region is positioned between the electrical connection and the fourth doped region so such that the portion of the third doped region forms a resistor coupled between a base of the second bipolar transistor and an emitter of the first bipolar transistor.

Another embodiment of the method may include forming the first doped region and the third doped region substantially simultaneously.

In an embodiment, the method may include forming at least a portion of the third doped region prior to forming the first doped region.

Those skilled in the art will appreciate that a semiconductor device may comprise; a first transistor, such as for transistor 16 or alternately transistor 116, having a first current carrying electrode, a second current carrying electrode, and a control electrode; a first bipolar transistor, such as for transistor 18 or alternately transistor 118, having a collector coupled to the first current carrying electrode of the first transistor, a base coupled to the second current carrying electrode of the first transistor, and an emitter of the first bipolar transistor coupled to a first node, such as for example node 15 or alternately node 115, of the semiconductor device.

In one embodiment, a component may be coupled between the control electrode of the first transistor and the emitter of the first bipolar transistor.

In an embodiment, the component may be a semiconductor resistor coupled between the first node and the control electrode of the first transistor.

Another embodiment may include that the first bipolar transistor has an emitter-collector breakdown voltage that is no less than one of an emitter-collector breakdown voltage of the first transistor or a gate-to-source operating of the first transistor.

In view of all of the above, it is evident that a novel device and method is disclosed. Included, among other features, is forming a protection transistor on a die with a main transistor. Those skilled in the art will appreciate from all the foregoing that the protection transistor, such as for example transistor 18, can be formed to determine the ESD characteristics of device 10 independently of the characteristics of the main transistor, such as for example transistor 16. Forming at least a portion of transistor 18 to underlie base contact conductor 39 facilitates forming transistor 18 without increasing the size of die 70 thus without increasing costs. Forming region 41 during the processing for region 29 can also facilitate forming transistor 18 without increasing costs.

While the subject matter of the descriptions are described with specific preferred embodiments and example embodiments, the foregoing drawings and descriptions thereof depict only typical and examples of embodiments of the subject matter and are not therefore to be considered to be limiting of its scope, it is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A bias resistor transistor semiconductor device comprising:
   a base terminal;
   an emitter terminal;
   a collector terminal;
   a main bipolar transistor having a base, an emitter coupled to the emitter terminal, and a collector coupled to the collector terminal;
   a first resistor having a first terminal coupled to the base of the main bipolar transistor, and having a second terminal coupled to the base terminal; and
   a protection bipolar transistor having a collector coupled to the collector of the main bipolar transistor, a base coupled to the emitter of the main bipolar transistor, and an emitter coupled to the base terminal, the protection bipolar transistor having an emitter to collector region that is configured to operate in avalanche mode in response to an ESD event.

2. The bias resistor transistor semiconductor device of claim 1 wherein at least a portion of the emitter of the protection bipolar transistor and at least a portion of the base of the protection bipolar transistor is formed to underlie a base contact pad of the bias resistor transistor semiconductor device wherein the base contact pad is coupled to the base terminal.

3. The bias resistor transistor semiconductor device of claim 1 wherein an emitter-base junction of the protection bipolar transistor is formed to underlie a base contact pad of the bias resistor transistor semiconductor device wherein the base contact pad is coupled to the base terminal.

4. The bias resistor transistor semiconductor device of claim 1 further including a protection resistor having a first terminal coupled to the base of the protection bipolar transistor and a second terminal coupled to the emitter of the main bipolar transistor.

5. The bias resistor transistor semiconductor device of claim 1 wherein the bias resistor transistor semiconductor device is in a semiconductor package having only the base, emitter, and collector terminals.

6. The bias resistor transistor semiconductor device of claim 1 further including a second resistor having a first terminal coupled to the base of the main bipolar transistor and a second terminal commonly coupled to the emitter of the main bipolar transistor and the emitter terminal.

7. The bias resistor transistor semiconductor device of claim 1 wherein the bias resistor transistor semiconductor device is formed on a semiconductor substrate of a first conductivity type having a first doped region of a second conductivity type that extends a first distance into the semiconductor substrate, a second doped region of the first conductivity type formed in the first doped region, a third doped region of the second conductivity type extending a second distance into the semiconductor substrate and spaced apart from the first doped region, and a fourth doped region of the first conductivity type formed in the third doped region wherein an intersection between the third and fourth doped regions forms an emitter-base junction of the protection bipolar transistor.

8. The bias resistor transistor semiconductor device of claim 7 wherein the second distance is greater than the first distance.

9. A method of forming a semiconductor device comprising:
   providing a semiconductor substrate of a first conductivity type, the semiconductor substrate having a first surface;
   forming a first doped region of a second conductivity type on the first surface of the semiconductor substrate and extending a first distance into the semiconductor substrate wherein the first doped region forms a base region of a first bipolar transistor;
   forming a second doped region of the first conductivity type in the first doped region wherein the second doped region forms an emitter region of the first bipolar transistor;
   forming a third doped region of the second conductivity type on the first surface of the semiconductor substrate and extending a second distance into the semiconductor substrate wherein the third doped region forms a base region of a second bipolar transistor;
   forming a fourth doped region of the first conductivity type in the third doped region wherein the fourth doped region forms an emitter region of the second bipolar transistor and wherein a portion of the semiconductor substrate forms a common collector region of both the first and second bipolar transistors;
   forming an electrical connection between the fourth doped region and a base node of the semiconductor device; and
   forming a component in series between the base node of the semiconductor device and the first doped region.

10. The method of claim 9 further including forming the semiconductor device to have only three active terminals.

11. The method of claim 9 further including forming a base connection pad of the semiconductor device overlying a portion of the third and fourth doped regions.

12. The method of claim 9 further including forming a base connection pad of the semiconductor device overlying at least a portion of an emitter-base junction formed between the emitter region and the base region of the second bipolar transistor.

13. The method of claim 9 further including forming the second distance to be one of substantially equal to the first distance or greater than the first distance.

14. The method of claim 9 further including forming a breakdown voltage between the emitter region and the collector region of the second bipolar transistor to be no less than a collector-emitter breakdown voltage of the first bipolar transistor.

15. The method of claim 9 further including forming an electrical connection between the third doped region and the second doped region wherein a portion of the third doped region is positioned between the electrical connection and the fourth doped region such that the portion of the third doped region forms a resistor coupled between the base region of the second bipolar transistor and the emitter region of the first bipolar transistor.

16. The method of claim 9 further including forming the first doped region and the third doped region substantially simultaneously.

17. The method of claim 9 further including forming at least a portion of the third doped region prior to forming the first doped region.

18. A semiconductor device comprising:
   a first transistor having a first current carrying electrode, a second current carrying electrode, and a control electrode;
   a first bipolar transistor having a collector coupled to the first current carrying electrode of the first transistor, a base coupled to the second current carrying electrode of the first transistor, and an emitter of the first bipolar transistor coupled to a first terminal of the semiconductor device;
   a component coupled between the control electrode of the first transistor and the emitter of the first bipolar transistor wherein a first terminal of the component is connected directly to the control electrode of the first transistor such that the component is coupled in series between the control electrode of the first transistor and a second terminal of the semiconductor device; and
   wherein the first transistor is one of a second bipolar transistor or a first MOS transistor, wherein the first bipolar transistor has an emitter-collector breakdown voltage that is either no less than an emitter-collector breakdown voltage of the second bipolar transistor or no less than a gate-to-source operating voltage of the first MOS transistor.

19. The semiconductor device of claim 18 wherein the component is a semiconductor resistor coupled between the first terminal of the semiconductor device and the control electrode of the first transistor.

* * * * *